(12) United States Patent
Hilliker et al.

(10) Patent No.: US 6,199,506 B1
(45) Date of Patent: Mar. 13, 2001

(54) RADIO FREQUENCY SUPPLY CIRCUIT FOR IN SITU CLEANING OF PLASMA-ENHANCED CHEMICAL VAPOR DEPOSITION CHAMBER USING $NF_3$ OR $NF_3$/HE MIXTURE

(75) Inventors: Stephen Hilliker, Los Gatos; Viral Hazari, San Jose; Sriram Seshagiri, San Jose; Zia Karim, San Jose, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/345,973

(22) Filed: Jun. 30, 1999

(51) Int. Cl.[7] ............................. C23C 16/00; H05H 1/00; H01J 7/24
(52) U.S. Cl. .................................. 118/723 E; 118/723 I; 156/345; 315/111.21; 315/111.51
(58) Field of Search .......................... 118/723 E, 723 I; 156/345; 315/111.21, 111.51

(56) References Cited

U.S. PATENT DOCUMENTS

| | | | |
|---|---|---|---|
| 5,653,811 | * | 8/1997 | Chan ................................... 146/345 |
| 5,815,047 | * | 9/1998 | Sorensen et al. ............... 315/111.21 |
| 6,016,131 | * | 1/2000 | Sato et al. ....................... 315/111.51 |

* cited by examiner

Primary Examiner—Gregory Mills
Assistant Examiner—Parviz Hassanzadeh
(74) Attorney, Agent, or Firm—Skjerven Morrill MacPherson LLP; David E. Steuber

(57) ABSTRACT

A plasma-enhanced chemical vapor deposition system includes a balancing inductor in the circuit path between the radio frequency generator and the "showerhead" that is used to introduce reactant gases to the system. The balancing inductor reduces the resonant frequency of the circuit to a level below the frequency of the signal produced by the radio frequency generator. Since the effective capacitance of the showerhead electrode varies monotonically with the power input to the plasma, fluctuations in the power delivered to the plasma will be self-correcting the system will be stabilized. For example, a drop in the power to the plasma will reduce the resonant frequency, but the corresponding reduction in the effective capacitance of the showerhead electrode will tend to increase the resonant frequency, thereby offsetting the change and stabilizing the system. Systems according to this invention are particularly useful in solving the plasma stability problems of using $NF_3$ or a mixture of $NF_3$ and one or more inert gases for the in situ cleaning of PECVD chambers used for depositing dielectric films.

9 Claims, 4 Drawing Sheets

RADIO FREQUENCY SUPPLY CIRCUIT FOR IN SITU CLEANING OF PLASMA-ENHANCED CHEMICAL VAPOR DEPOSITION CHAMBER USING NF₃ OR NF₃/HE MIXTURE

FIELD OF THE INVENTION

This invention relates to plasma-enhanced chemical vapor deposition chambers containing single or multiple electrode systems and in particular to radio frequency circuitry that enables the chamber to be cleaned evenly in a stable radio frequency (RF) plasma in situ using $NF_3$ or a mixture of $NF_3$ and He.

BACKGROUND OF THE INVENTION

When plasma-enhanced chemical vapor deposition chambers are used repeatedly for thin film deposition, a layer of the material to be deposited gradually builds up on the interior surfaces of the chamber. The chamber must therefore be cleaned periodically. This can be done by disassembling the system, but there are many advantages to cleaning the chamber in situ by etching the deposits from the interior surfaces. For systems used to deposit dielectric films, perfluoro compounds (i.e., $C_2F_6$ and other gases containing carbon and fluorine) have been used for in situ cleaning. It is believed, however, that the use of perfluoro compounds (PFC's) may generate gases that contribute to global warming, and the major U.S. integrated circuit manufacturers have entered into a memorandum of understanding with the U.S. Environmental Protection Agency that calls for voluntary efforts to reduce the levels of PFC generation.

One way of reducing the level of PFC's is to switch to fluorinated source gases such as $NF_3$, either alone or mixed with He or other inert gases. These gases have an inherently higher etch rate and are therefore more efficient in cleaning the chambers. One obstacle to doing this in a plasma-enhanced chemical vapor deposition (PECVD) chamber, however, is that $NF_3$ generates an electronegative plasma which is more difficult to stabilize than the plasma created by PFC's. Electronegative plasmas have stability problems because the impedance of an electronegative plasma increases as it becomes more electronegative. This causes less power to be delivered to the plasma. If this trend is sufficiently fast, the plasma will be extinguished. After charge neutralization occurs, the plasma will be re-ignited and will proceed through this cycle again. In a multi-electrode PECVD system the power will not be distributed equally among the electrodes because the power will go preferentially to the lower impedance electrodes.

Unless the plasma is stabilized, oscillations can occur in the plasma and between electrodes such that controlled power delivery is difficult at best and the impedance matching network cannot achieve a match. Stabilizing gases have been used to mitigate this situation, but these gases may reduce the maximum etch rate achievable. With an unstable plasma, arcing can also cause serious damage to the chamber.

Thus there is a clear need for a way of stabilizing an $NF_3$ containing plasma in a PECVD chamber.

SUMMARY OF THE INVENTION

A plasma-enhanced chemical vapor deposition system in accordance with this invention comprises a supporting member for supporting one or more substrates; a radio frequency generator; one or more showerheads positioned over the supporting member and connected through a circuit path to the radio frequency generator; and a balancing inductor in the circuit path, the inductance of the balancing inductor being such that the resonant frequency of the circuit path is less than the frequency of a signal output by the radio frequency generator. With this arrangement, any fluctuations in the power input to the plasma will be self-correcting. For example, a reduction in power tends to shift the resonant frequency of the circuit path higher because the effective capacitance of the showerhead electrode is reduced. Conversely, an increase in power lowers the resonant frequency because the electrode capacitance is increased. Preferably the changes in the resonant frequency and the electrode capacitance are correlated such that the stability of the system is optimized.

The principles of this invention are also applicable to high density plasma (HDP) or inductively coupled plasma (ICP) systems, wherein the power is inductively coupled to the plasma by coils that surround the reaction chamber. In these cases balancing capacitors must be added to the circuit to shift the resonant frequency to the desired point in relation to the operating frequency of the RF generator.

BRIEF DESCRIPTION OF THE DRAWINGS

This invention will be best understood by reference to the following drawings.

DESCRIPTION OF THE INVENTION

Figure 1:
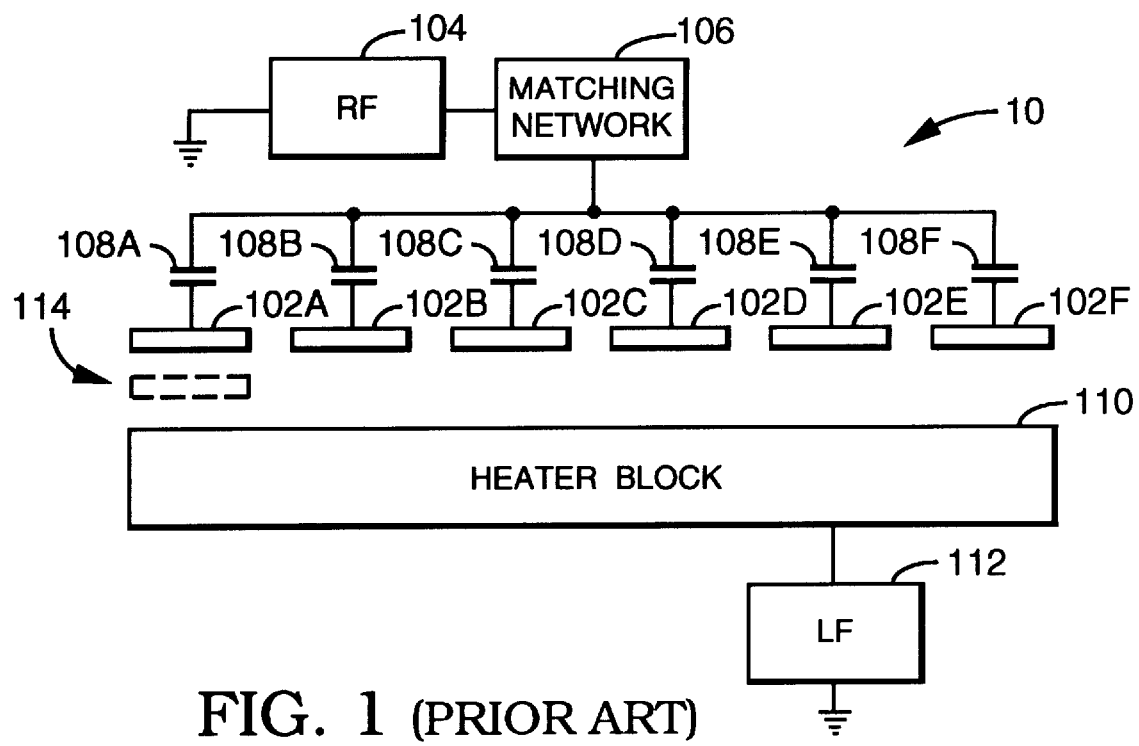
FIG. 1 is a schematic diagram of a prior art PECVD system.

FIG. 1 is a schematic diagram of a prior art plasma-enhanced chemical vapor deposition (PECVD) system, showing the components that are necessary for an understanding of this invention. PECVD system 10 is a multi-station system which contains six PECVD electrodes. It is exemplified by the Concept II Sequel PECVD system manufactured by Novellus Systems, Inc., the assignee of this application, which is used for depositing dielectric films.

PECVD system 10 includes six "showerheads" 102A–102F, which are used for introducing the reactant gases into the deposition chambers. In this embodiment the showerheads are in a single chamber, but in other embodiments the showerheads are in separate chambers. A high-frequency signal is generated by an RF generator 104 and delivered through an impedance matching network 106 to showerheads 102A–102F. The circuit path from impedance matching network 106 leads through capacitors 108A–108F, which are variable capacitors set at 1000 pF. The high frequency signal is generally at 13.56 MHz, which is a frequency approved by the Federal Communications Commission for industrial uses. In the Novellus Concept 11 Sequel system, RF generator 104 is the model RFG 5500 from Advanced Energy of Fort Collins, Colo., and matching network 106 is from Trazar of San Jose, Calif.

PECVD system 10 also includes a heater block 110, which contains platens for holding the wafers to be processed. Heater block 110 is connected to a low-frequency generator 112, which delivers an output at 250 kHz. In operation, when RF generator 104 and low-frequency generator 112 are functioning and reactant gases are supplied through showerheads 102A–102F, plasmas are created between showerheads 102A–102F and heater block 110, illustrated by the plasma 114 (shown in dashed lines) beneath showerhead 102A.

Figure 2:
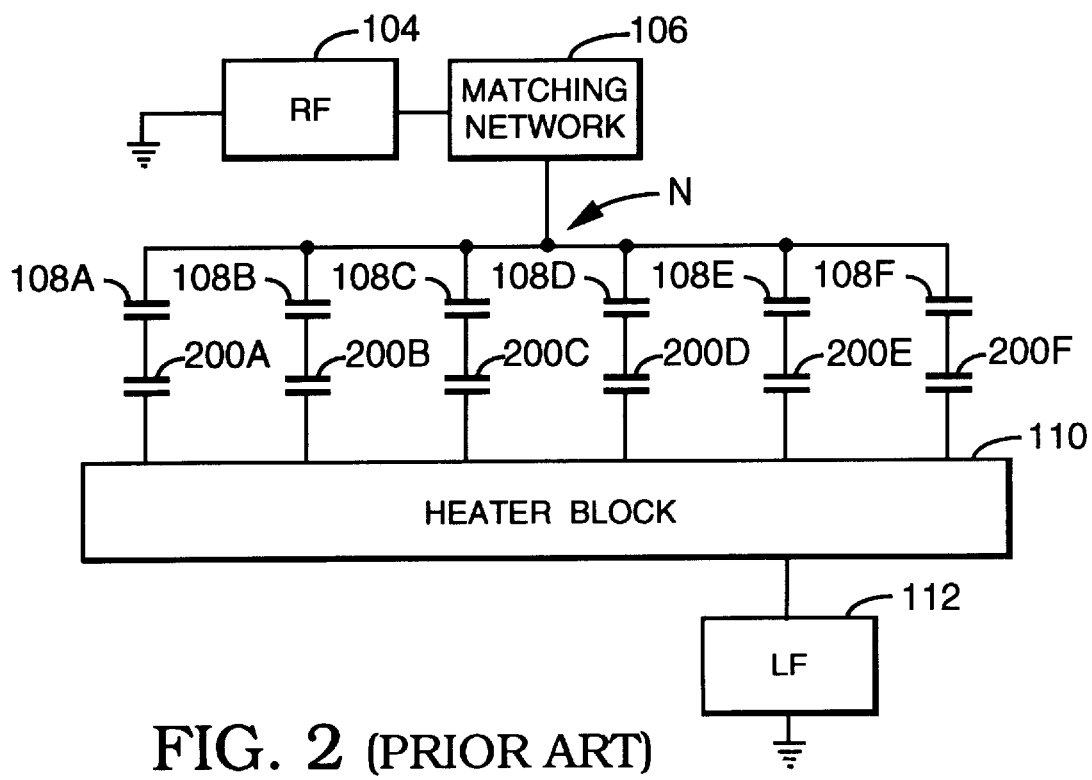
FIG. 2 is a schematic electrical diagram of a prior art PECVD system.

Electrically, the region between each of showerheads 102A–102F and the heater block 110 acts as a capacitor, with the value of the capacitance depending on, among other things, the nature of the intervening plasma. FIG. 2 is an electrical schematic diagram of PECVD system with capacitors 200A–200F representing the capacitance associated with the plasmas. Each showerhead is thus associated with a resonant circuit including one of capacitors 108A–108F, one of capacitors 200A–200F, and the effective series inductance of the interconnects between the matching network 106 and each showerhead.

Figure 3:
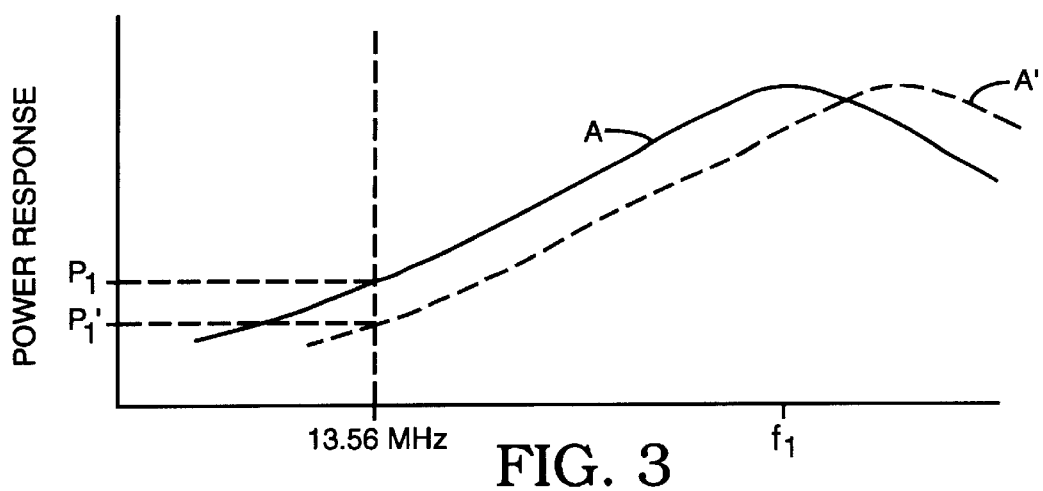
FIG. 3 is a frequency response curve for a prior art showerhead circuit.

FIG. 3 is a typical frequency response curve A for the resonant circuits of FIG. 2, showing power as a function of frequency. For the multiple station system shown in FIG. 2, the frequency response is viewed from the common node N at which the circuits for the individual showerheads are joined. As explained more fully below, if the system were a single-station system, the frequency response would be for the entire circuit from the RF generator to the showerhead electrodes. As noted, the resonant frequency $f_1$ is located well above the 13.56 MHz frequency output by RF generator 104.

Figure 4:
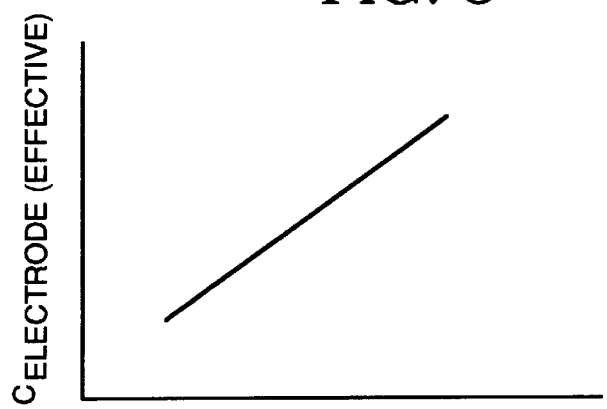
FIG. 4 is a graph showing the effective electrode capacitance of a showerhead and plasma as a function of power.

This system is inherently unstable. FIG. 4 is a diagram illustrating the value of the effective capacitance associated with each of the plasmas ($C_{electrode}$(eff)) as a function of the power delivered to the plasma. Generally, a higher power level reduces the distance across the sheath in the plasma and increases the capacitance. If as a result of some disturbance (e.g., an arc) the power provided to the plasma should fall, the response curve A would shift to the right, as represented by curve A' in FIG. 3. This is necessary because the power $p_1$ has fallen to $p_1$'. However, as shown by FIG. 4, a reduction in power input also reduces the effective electrode capacitance $C_{electrode}$(eff). Reducing the capacitance tends to increase the resonant frequency which in turn will further reduce the power input. Thus the response curve in FIG. 3 will continue to shift to the right and the system will be "out of control". Conversely, a power surge will cause the response curve to shift to the left.

Figure 5:
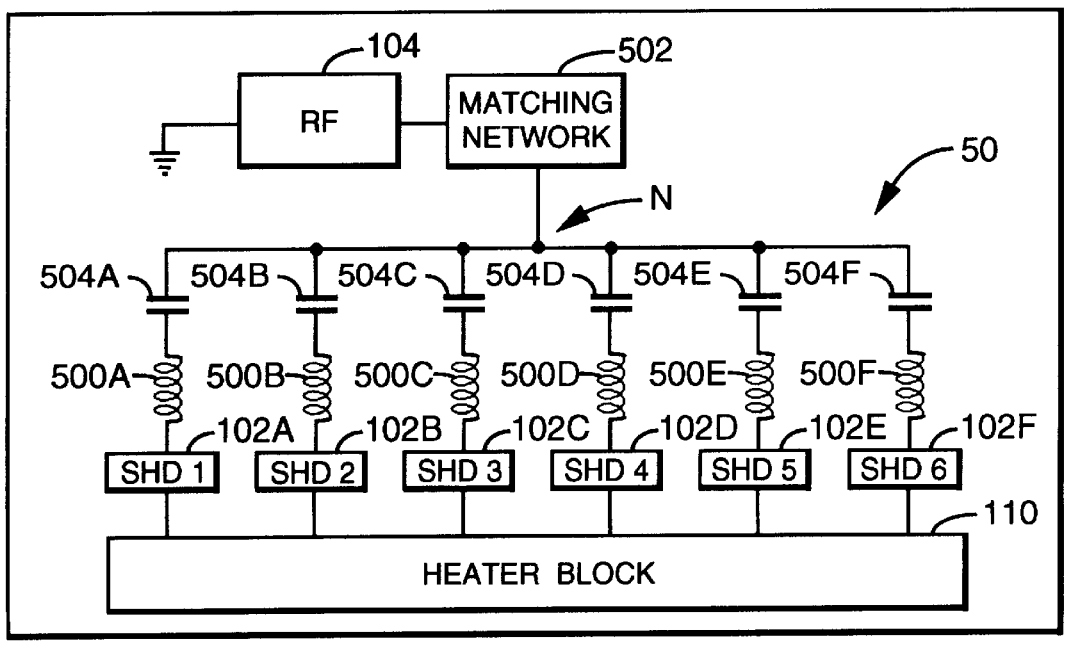
FIG. 5 is a schematic diagram of a PECVD system containing balancing inductors in accordance with this invention.

FIG. 5 illustrates a schematic view of a PECVD system 50 in accordance with this invention. In one embodiment RF generator 104, showerheads 102A–102F, heater block 110, and low-frequency generator 112 (not shown) remain the same. Impedance matching network 502 is the Mercury 3013 from Advanced Energy. Variable capacitors 102A–102F are replaced by fixed ceramic capacitors 504A–504F, which have values of 1330 pF.

Balancing inductors 500A–500F are added in the circuit paths between matching network 502 and showerheads 102A–102F, respectively. Balancing inductors 500A–500F reduce the resonant frequency of the circuits associated with showerheads 102A–102F, respectively, and yield a frequency response represented by curve B in FIG. 6, with a resonant frequency $f_2$ that is below the 13.56 MHz frequency output by RF generator 104. Now, if the power falls from $p_2$ to $p_2$', the frequency response curve B will shift to the left, as represented by curve B' in FIG. 6. The accompanying reduction in the effective capacitance $C_{electrode}$(eff) (see FIG. 4) will tend to increase the resonant frequency, however, driving the response curve B back towards equilibrium at the frequency $f_2$. The system is therefore stabilized.

The resonant frequency of the circuit path between the matching network 502 and the showerheads (electrodes) 102A–102F is calculated using the well known equation $$f_r = 1/(2\pi\sqrt{LC})$$

The inductors 500A–500F are chosen to provide an inductance L which, taking account of $C_{electrode}$(eff) and any other capacitance, gives the desired resonant frequency $f_r$ for the showerhead circuit.

In some cases the range of the impedance matching network 502 will have to be adjusted to accommodate the increased inductance represented by the addition of inductors 500A–500F. For example, in the Trazar impedance matching network nine 101 pF capacitors were replaced by nine 47 pF capacitors for this purpose.

Figure 7:
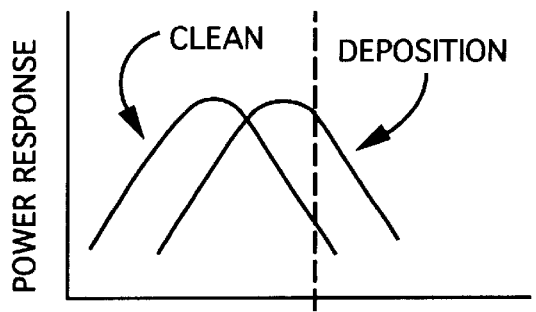
FIG. 7 illustrates frequency response curves for a showerhead circuit during clean and deposition cycles, respectively.

Typically, a different response curve will apply to the cleaning and deposition functions of a particular unit, with $C_{electrode}$(eff) for the respective plasmas determining the resonant frequency in each instance. Normally, the clean cycle is operated at a higher power than the deposition cycle. Higher power generally equates to a smaller distance across the sheath of the plasma and a higher capacitance. Thus $C_{electrode}$(eff) for the clean cycle is greater than $C_{electrode}$(eff) for the deposition cycle. As a result, the resonant frequency for the clean cycle is lower than the resonant frequency for the deposition cycle, as shown in FIG. 7. In most cases the proper value of the balancing inductors 500A–500F to provide proper resonant frequencies for the clean and deposition cycles, and to meet all of the other performance criteria, is determined empirically.

Balancing inductors can be used in both single-station and multiple-station PECVD systems. In multiple-station systems, such as the one illustrated in FIG. 5, the use of balancing inductors also helps to solve the loading/unloading problem. This problem arises when the first wafer is loaded into or the last wafer is unloaded from the system. In those situations, one or more of the stations do not have wafers in them, and thus have a different lower $C_{electrode}$(eff) compared to the stations that contain a wafer. In previous non-optimized systems there is typically more deposition on the first wafers in and the last wafers out of the system, because these wafers get more power due to the higher capacitance (lower impedance) when a wafer is present in the station. As described above, when the resonant frequency is adjusted to a point that is below the operating frequency by using balancing inductors, a higher capacitance tends to reduce the power, thereby compensating for the "first wafer in, last wafer out" effect.

Figure 6:
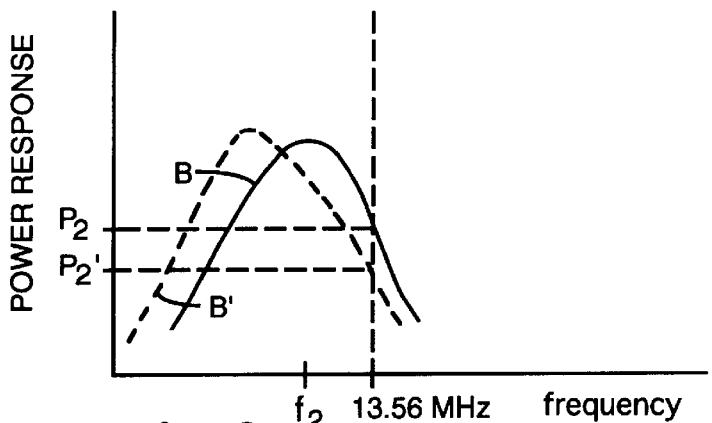
FIG. 6 is a frequency response curve for showerhead circuit which contains a balancing inductor.
Figure 8A:
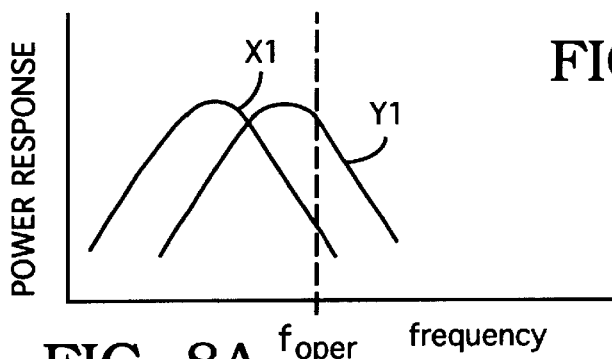
FIGS. 8A and 8B are a frequency response curve of a showerhead circuit and a curve of the effective electrode capacitance as a function of power, respectively, which help to show how the balancing inductors should be chosen.
Figure 8B:
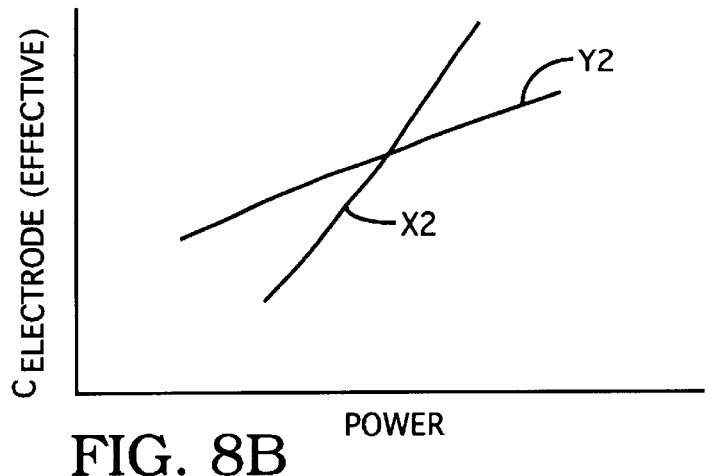

For good stability, the inductance of the balancing inductor should be chosen such that the sensitivity of $C_{electrode}$ (eff) and the resonant frequency, respectively, to perturbations in the power input are correlated. An approximate way of visualizing this is illustrated in FIGS. 8A and 8B. FIG. 8A is a frequency response curve similar to the one shown in FIG. 6 showing power as a function of frequency; FIG. 8B is a curve of $C_{electrode}$(eff) as a function of power, similar to FIG. 4. The slope of the frequency response curve at the operating frequency $f_{oper}$ in FIG. 8A should be correlated to the slope of the $C_{electrode}$(eff) curve in FIG. 8B. For example, curve X1 in FIG. 8A, which has a relatively steep slope at $f_{oper}$ would be a better match for curve X2 than curve Y2 in Fig. 8B, since the slope of curve X2 (absolute value) is closer to the slope of curve X1 at $f_{oper}$. Similarly, the slope of curve Y1 at $f_{oper}$ is close to the slope (absolute value) of curve Y2. Generally, the lower the slope of the $C_{electrode}$(eff) curve the closer the resonant frequency should be to the operating frequency.

For multiple station systems, the frequency response is viewed outward from the node N from which the circuit paths to the individual stations extend. As described above, an inductor is added into each of these circuit paths to reduce the resonant frequency of these circuit paths to the desired point below the operating frequency of the RF generator 104. The matching network can be tuned (e.g., using the auto tune setting available on many matching networks) to provide an optimal zero phase angle signal, with no power reflected back to the generator 104.

In a single-station system the frequency response is viewed for the entire circuit path from the RF generator through the showerhead electrode capacitance. The resonant frequency of this circuit must be reduced to the desired point below the operating frequency of the RF generator 104. This can sometimes be accomplished by mistuning the impedance matching network 502, for example, by taking impedance matching network 502 off of "auto tune" and adjusting (increasing) the variable capacitors within impedance matching network 502 to effectively increase the inductance in the circuit path by the requisite amount. In many cases, however, it will be necessary to add external inductors into the circuit to reduce the resonant frequency by the required amount to achieve the relationship between the frequency response and $C_{electrode}$(eff) curves described above. In either case the effect is a non-zero phase angle in the circuit and power that is reflected back to RF generator 104. Thus, in a single-station system RF generator 104 has to provide additional power to compensate for the lost power that results from the adjustment of the resonant frequency in accordance with this invention.

As noted above, the use of balancing inductors solves the plasma stability problems of using $NF_3$ or a mixture of $NF_3$ and He or other inert gases to clean the inside surfaces of PECVD chambers that are used for depositing dielectric layers. For example, a mixture of $NF_3$ and He wherein $NF_3$ accounts for from 5% to 100% of the total can be used, the pressure can be from 0.5 to 3.5 Torr, the $NF_3$ flow rate from 0.5 to 5.0 SLM; the He flow rate from 0 to 10.0 SLM; the high-frequency power from 0.5 to 5.0 KW; and the low-frequency power from 0 to 2.5 KW. The deposited film may be silicon dioxide, silicon nitride, TEOS oxide, antireflective layers (silicon oxynitride), or another dielectric film.

Figure 9A:
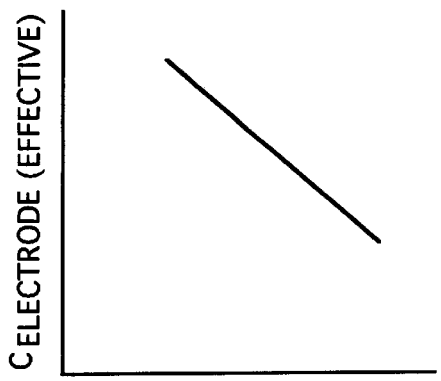
FIGS. 9A and 9B are a frequency response curve of a showerhead circuit and a curve of the effective electrode capacitance as a function of power, which illustrate how the resonant frequency should be placed when the effective electrode capacitance decreases as a function of power.
Figure 9B:
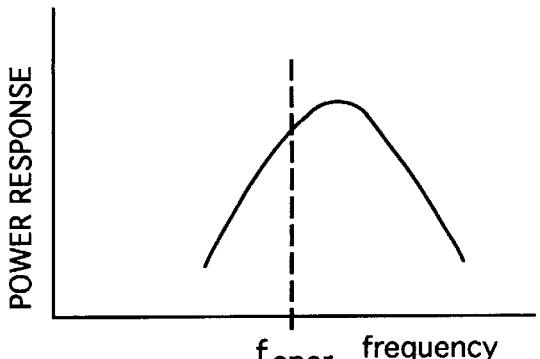

Depending on the gases and chamber design, in some embodiments the curve of capacitance as a function of power may have a negative slope, as shown in FIG. 9A. In other words the electrode capacitance decreases as the power input increases. In such embodiments the system is designed such that the resonant frequency is slightly to the right of the operating frequency, as shown in FIG. 9B.

Figure 10:
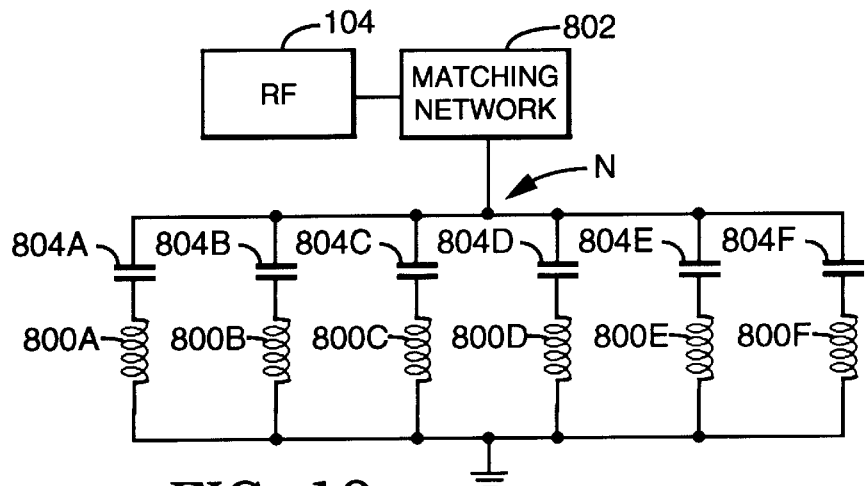
FIG. 10 is an electrical circuit diagram of a high density PECVD system wherein the power is inductively coupled to the plasma.
Figure 11A:
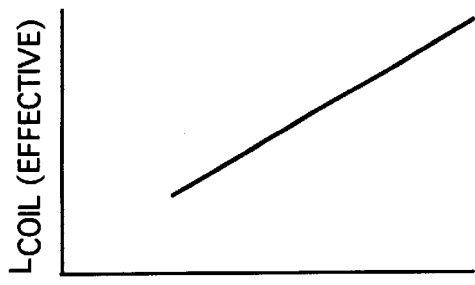
FIGS. 11A and 11B are curves of the effective inductance as a function of power and the frequency response of the system shown in FIG. 10.
Figure 11B:
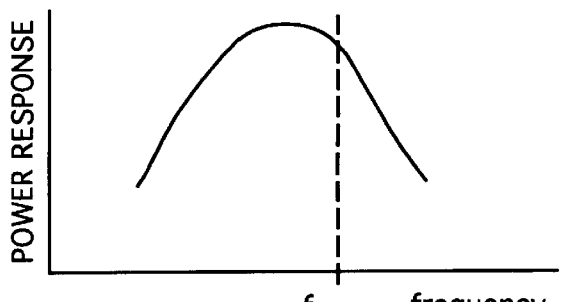

In HDP or ICP systems the plasma is produced inductively by coils that surround the reaction chambers. Such a system is represented in FIG. 10 where coils 800A–800F are used to couple the RF signal produced by RF generator 104 to the plasma. In this type of arrangement, balancing capacitors 804A–804F are added to the circuit to shift the resonant frequency to a point around the operating frequency where the slope of the frequency response curve at the operating frequency is opposite to the slope of the effective inductance curve ($L_{coil}$(eff)) of coils 800A–800F as a function of power. This is illustrated in FIGS. 11A and 11B.

The embodiments described above are illustrative and not limiting of the broad scope of this invention. All specific components and values are only exemplary. Many additional embodiments in accordance with this invention will be obvious to those skilled in the art.

We claim:

1. A plasma-enhanced chemical vapor deposition system comprising:

a supporting member for supporting a substrate;

a radio frequency generator for generating a plasma;

a showerhead electrode positioned over the supporting member and connected through a circuit path to the radio frequency generator; and a balancing inductor in the circuit path, the inductance of the balancing inductor being such that a resonant frequency of the circuit path is less than a frequency of a signal output by the radio frequency generator so that fluctuations in the power input to the plasma are self-correcting.

2. The plasma-enhanced chemical vapor deposition system of claim 1 wherein the circuit path includes an impedance matching network.

3. The plasma-enhanced chemical vapor deposition system of claim 1 comprising a plurality of showerheads, each of the showerheads being connected to the radio frequency generator through a circuit path, each circuit path including a balancing inductor.

4. A plasma-enhanced chemical vapor deposition system comprising:

a supporting member for supporting a substrate;

a radio frequency generator;

a coil for producing an inductively coupled plasma, the coil being connected through a circuit path to the radio frequency generator; and a balancing capacitor in the circuit path, the capacitance of the balancing capacitor being such that a resonant frequency of the circuit path is less than a frequency of a signal output by the radio frequency generator so that fluctuations in the power input to the plasma are self-correcting.

5. The plasma-enhanced chemical vapor deposition system of claim 4 wherein the circuit path includes an impedance matching network.

6. The plasma-enhanced chemical vapor deposition system of claim 4 comprising a plurality of coils, each of the coils being connected to the radio frequency generator through a circuit path, each circuit path including a balancing capacitor.

7. The plasma-enhanced chemical vapor deposition system of claim 4 wherein the plasma produced is an electronegative plasma.

8. A plasma-enhanced chemical vapor deposition system comprising:

a supporting member for supporting a substrate;

a radio frequency generator;

a showerhead electrode positioned over the supporting member connected through a circuit path to the radio frequency generator and providing a reactant gas;

a low-frequency generator electrically connected to the supporting member, the radio frequency generator and the low-frequency generator creating a plasma from the reactant gas when activated; and a balancing inductor in the circuit path, the inductance of the balancing inductor selected such that fluctuations in the power input to the plasma are self-correcting.

9. The plasma-enhanced chemical vapor deposition system of claim 8 wherein the plasma comprises $NF_3$.

* * * * *